(12) United States Patent
Yong et al.

(10) Patent No.: US 10,461,155 B2
(45) Date of Patent: Oct. 29, 2019

(54) EPITAXIAL REGION FOR EMBEDDED SOURCE/DRAIN REGION HAVING UNIFORM THICKNESS

(71) Applicant: GLOBALFOUNDRIES Inc., Grand Cayman (KY)

(72) Inventors: Yoong Hooi Yong, Ballston Lake, NY (US); Yanping Shen, Saratoga Springs, NY (US); Hsien-Ching Lo, Clifton Park, NY (US); Xusheng Wu, Ballston Lake, NY (US); Joo Tat Ong, Ballston Lake, NY (US); Wei Hong, Clifton Park, NY (US); Yi Qi, Niskayuna, NY (US); Dongil Choi, Watervliet, NY (US); Yongjun Shi, Clifton Park, NY (US); Alina Vinslava, Ballston Lake, NY (US); James Psillas, Ballston Spa, NY (US); Hui Zang, Guilderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/811,990

(22) Filed: Nov. 14, 2017

(65) Prior Publication Data
US 2019/0148492 A1 May 16, 2019

(51) Int. Cl.
*H01L 29/08* (2006.01)
*H01L 27/092* (2006.01)
(Continued)

(52) U.S. Cl.
CPC .... *H01L 29/0847* (2013.01); *H01L 21/02576* (2013.01); *H01L 21/823814* (2013.01); *H01L 21/823821* (2013.01); *H01L 27/0924* (2013.01); *H01L 29/165* (2013.01); *H01L 29/6656* (2013.01); *H01L 29/7848* (2013.01); *H01L 27/092* (2013.01)

(58) Field of Classification Search
CPC combination set(s) only.
See application file for complete search history.

(56) References Cited

U.S. PATENT DOCUMENTS

| 8,796,759 B2 | 8/2014 | Perng et al. |
| 9,530,869 B2 | 12/2016 | Akarvardar et al. |
| 2008/0119031 A1* | 5/2008 | Pal ............... H01L 29/045 438/483 |

* cited by examiner

*Primary Examiner* — Ratisha Mehta
(74) *Attorney, Agent, or Firm* — Francois Pagette; Hoffman Warnick LLC

(57) ABSTRACT

A semiconductor structure including a source/drain region is disclosed. The source/drain region may include a first epitaxial region along at least one sidewall of the source/drain region having a substantially uniform sidewall thickness. The semiconductor structure may further include a gate structure adjacent and above the source/drain region wherein at least a portion of the first epitaxial region is positioned below a sidewall spacer of the gate structure. A method of forming a source/drain region including a first epitaxial region having a substantially uniform sidewall thickness is disclosed. The method may include forming a trench in a substrate adjacent to a gate structure, forming the first epitaxial region in the trench, forming a spacer material layer on the gate structure and on a portion of the first epitaxial region, and removing a portion of the first epitaxial region using the spacer material layer as a mask.

10 Claims, 8 Drawing Sheets

(51) Int. Cl.
*H01L 21/02* (2006.01)
*H01L 21/8238* (2006.01)
*H01L 29/66* (2006.01)
*H01L 29/78* (2006.01)
*H01L 29/165* (2006.01)

EPITAXIAL REGION FOR EMBEDDED SOURCE/DRAIN REGION HAVING UNIFORM THICKNESS

BACKGROUND

The present disclosure relates to semiconductor device fabrication, and more specifically, to source/drain regions with a first epitaxial region having a substantially uniform sidewall thickness.

Conventional integrated circuits, such as microprocessors, storage devices, etc., include millions of circuit elements including structures such as transistors. Transistors come in a variety of shapes and forms, e.g., planar, fin-type, nanowire, etc. Irrespective of the physical configuration of the transistor device, each transistor comprises source/drain regions in a substrate, and a gate structure defining a channel region positioned between the source/drain regions. For example, where the transistor is a FinFET, the gate structure may be formed on the fin, and the source/drain regions may be formed in and/or on portions of the fin not covered by the gate structure. Transistors may be utilized by applying a predetermined control voltage to the gate structure causing the channel region to become conductive below the gate structure and between the source/drain regions. The transistors are generally either an N-type (NFET) or P-type (PFET) transistor device wherein the "N" and "P" indicate the type of dopants used to create the source/drain regions of the devices.

At a later point in integrated circuit fabrication, contact structures are typically formed to the source/drain regions of the transistors for electrical connection thereto. Generally, it is desirable to make the area of the interface between the contact structures and the source/drain regions as large as possible and as exhibiting as low of an electrical resistance as possible. Source/drain region formation may include the growth of epitaxial material to create a larger landing area for contact structures. One conventional method for forming epitaxial material in a source/drain region of a transistor is referred to as an "embedded epi." Forming an "embedded" epitaxial material may include removing an upper portion of the source/drain region of the transistor (e.g., an upper portion of the fin in a FinFET), and growing epitaxial material therein. The formation may include growing a single embedded epitaxial material region, or multiple embedded epitaxial material regions with different dopant concentrations from the source/drain regions.

One challenge associated with forming an "embedded" epitaxial material may include contact resistance reduction and performance degradation where a single embedded epitaxial material with a high concentration of dopant is formed. Another challenge associated with forming an "embedded" epitaxial layer may include increased contact resistance and degradation of performance where a first embedded epitaxial region with a low concentration of dopant is formed thinly on fins in the source/drain regions near the gate structure.

SUMMARY

A first aspect of the disclosure is directed to a semiconductor structure, including: a first gate structure positioned on a substrate, the gate structure including a first body having an uppermost surface and sidewalls, and a first spacer positioned on at least the sidewalls of the body; and a source/drain region positioned in the substrate and adjacent to the body of the gate structure, the source/drain region including: a first sidewall; a second sidewall opposite the first sidewall; a bottommost surface extending between the first sidewall and the second sidewall; a first portion of an epitaxial region positioned along the first sidewall of the source/drain region below at least a portion of the first spacer of the gate structure, the first portion of the first epitaxial region having a substantially uniform sidewall thickness; and a second epitaxial region in the source/drain region abutting the first portion of the first epitaxial region.

A second aspect of the disclosure includes a method of forming an embedded source/drain region in a substrate, the method including: forming a trench in the substrate adjacent to a gate structure positioned thereon, the trench having a first sidewall, a second sidewall opposite the first sidewall, and a bottommost surface extending between the first sidewall and the second sidewall; forming a first epitaxial region at least partially in the trench; forming a first spacer layer on the gate structure and on a portion of an uppermost surface of the first epitaxial region adjacent to the gate structure; removing a first portion of the first epitaxial region using the first spacer layer as a mask, wherein after the removing the first portion of the epitaxial region a thickness of a remaining portion of the epitaxial region has a substantially uniform sidewall thickness; and forming a second epitaxial region in the trench abutting the remaining portion of the first epitaxial region to form the embedded source/drain region.

A third aspect of the disclosure is related to a method of forming a source/drain region including: forming a first spacer material layer on a P-type field effect transistor (PFET) region of a substrate and an N-type field effect transistor (NFET) region of the substrate, the NFET region including a gate structure positioned on the substrate; forming a mask above the first spacer material layer in the PFET region; forming an opening in the first spacer material layer and the substrate adjacent to the gate structure in the NFET region; removing the mask; forming a first epitaxial region in at least a portion of the opening; forming a second spacer material layer on the first spacer material layer and on a portion of an uppermost surface of the first epitaxial region adjacent to the gate structure; removing a first portion of the first epitaxial region using the second spacer material layer as a mask, wherein after removing the first portion a remaining portion of the first epitaxial region includes a substantially uniform sidewall thickness; and forming a second epitaxial region abutting the remaining portion of the first epitaxial region in the opening to form the source/drain region.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely illustrative.

Embodiments of the present disclosure provide a method for forming source/drain regions of a transistor including a first epitaxial region having a substantially uniform sidewall thickness. Methods according to the disclosure may include forming a spacer material layer on a gate structure adjacent to the source/drain region and partially on the first epitaxial region in the source/drain region; and removing a portion of the first epitaxial region using the spacer layer as a mask. Embodiments of the disclosure may allow for epitaxial regions with uniform thickness to be formed on the sidewalls and/or bottommost portion of the source/drain regions. Forming the first epitaxial region with substantially uniform sidewall thickness may reduce resistance and improve drive current at an interface between the source/drain region and a subsequently formed contact structure thereto.

Figure 1:
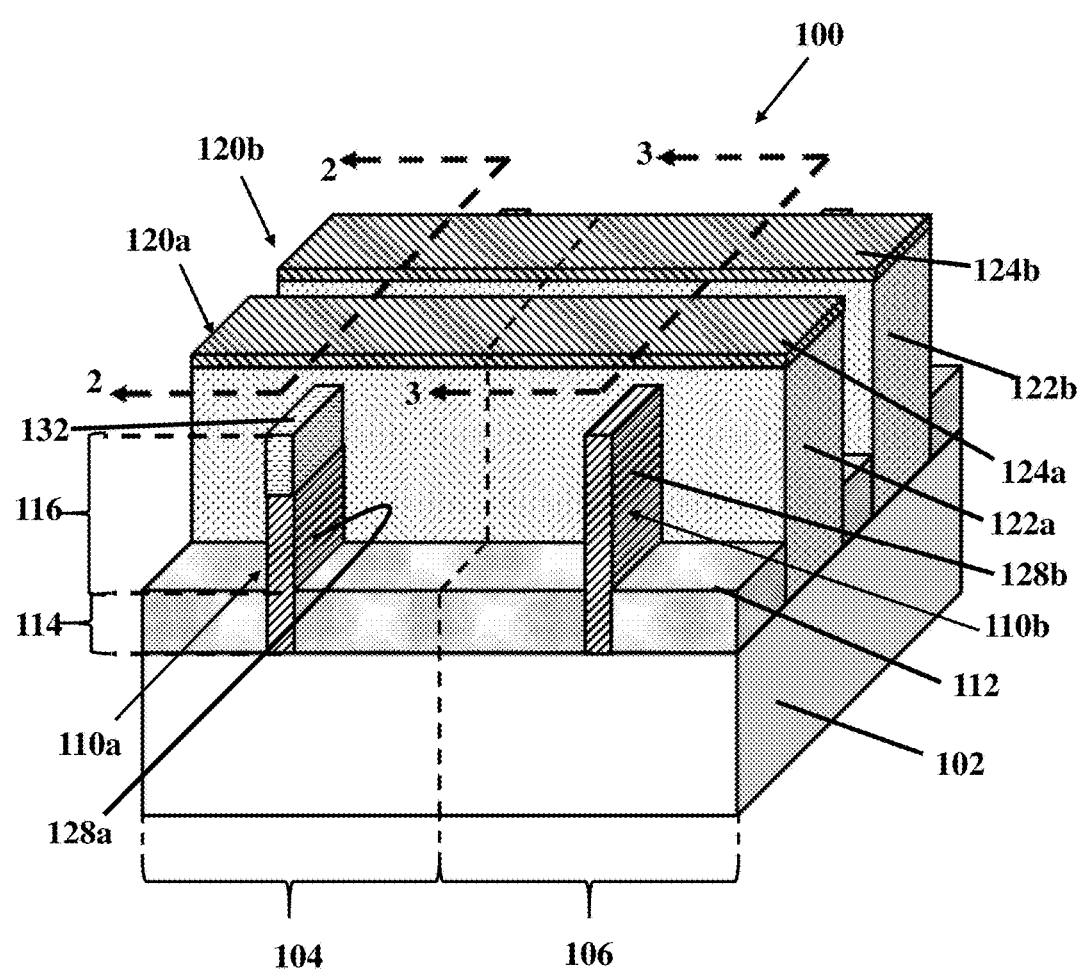
FIG. 1 shows a perspective view of an initial structure, according to the prior art.
Figure 2:
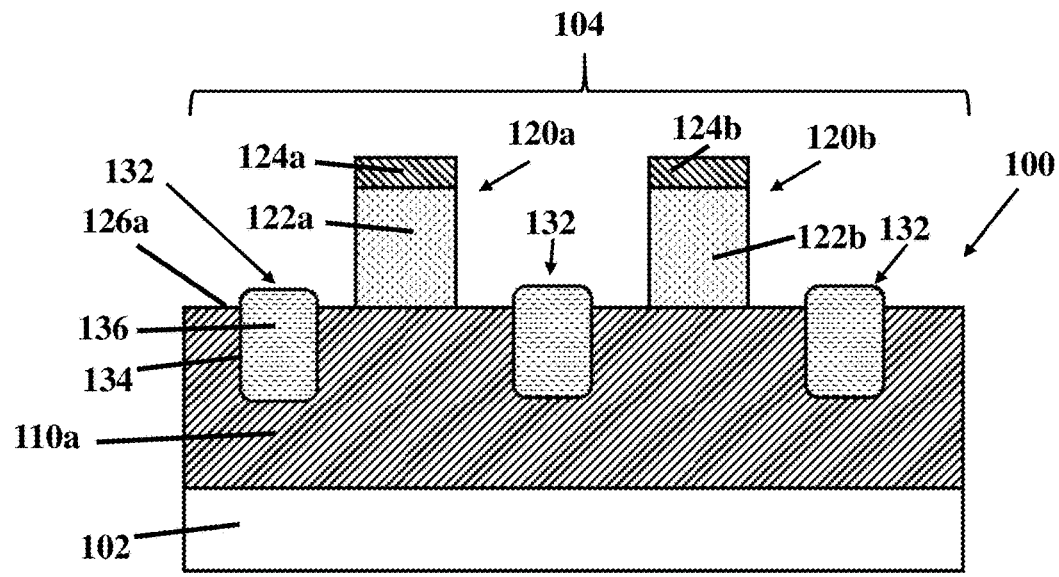
FIG. 2 shows a cross-sectional view of the initial structure of FIG. 1 in a PFET region, according to embodiments of the disclosure.
Figure 3:
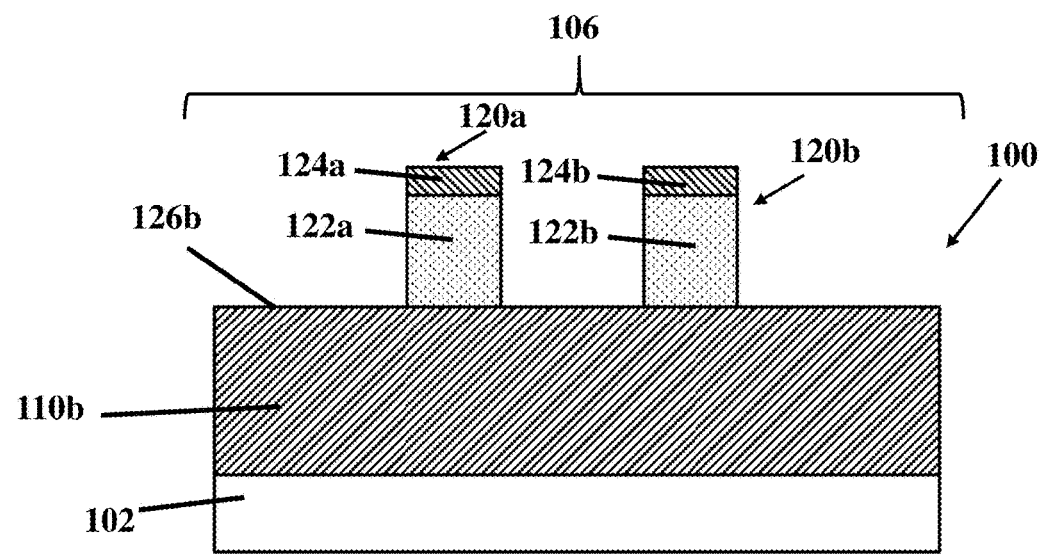
FIG. 3 shows a cross-sectional view of the initial structure of FIG. 1 in an NFET region, according to embodiments of the disclosure.

Turning to the drawings, FIGS. 1-3 show an initial structure 100 for forming embedded source/drain regions, according to embodiments of the disclosure. FIG. 1 shows a perspective view of initial structure 100, FIG. 2 shows a cross-sectional view of initial structure 100 at line 2-2 in FIG. 1, and FIG. 3 shows a cross-sectional view of initial structure 100 at line 3-3 in FIG. 1. As shown in FIGS. 1-3 initial structure 100 may include a substrate 102 upon which the remainder of the initial structure may be formed. Substrate 102 may be formed using any now known or later developed semiconductor fabrication techniques for forming a substrate. Substrate 102 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entirety of each layer may be strained. Although not shown, substrate 102 may alternatively include a silicon-on-insulator (SOI) substrate formed by conventional semiconductor techniques for forming an SOI substrate. Substrate 102 may be separated into a P-type field effect transistor (PFET) region 104 and an N-type field effect transistors (NFET) region 106, for forming PFET structures and NFET structures therein, respectively.

As also shown in FIGS. 1 and 2, substrate 102 of initial structure 100 may include a first fin 110a vertically extending therefrom in PFET region 104 for a PFET structure. As shown in FIGS. 1 and 3, substrate 102 of initial structure 100 may include a second fin 110b vertically extending therefrom in NFET region 106 for an NFET structure. Fins 110a,b may be formed on substrate 102 by conventional semiconductor fabrication techniques for forming vertical fins for field effect transistors (FETs). For example, fins 110a,b may be formed by patterned epitaxial growth of substrate 102 and/or patterned etching of substrate 102, using a mask (not shown). "Epitaxy" or "epitaxial growth," as used herein, refers to a process by which a thin layer of single-crystal or large-grain polycrystalline material is deposited on a base material with similar crystalline properties. Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

As shown in FIG. 1, once fins 110a,b have been formed on substrate 102, an insulating layer 112 may be formed on substrate 102 and adjacent to fins 110a,b to electrically isolate the fins from one another and/or other nearby structures not shown. As shown in the example of FIG. 1, insulating layer 112 may be formed to cover only a bottom portion 114 of fins 110a,b extending from substrate 102. An upper portion 116 of fins 110a,b may remain exposed, for example, for the formation of source/drain regions therein. Insulating layer 112 may be formed on substrate 102 by conventional semiconductor fabrication techniques for forming an insulator layer on a substrate. For example, insulating layer 112 may be formed on substrate 102 by deposition, planarization, patterning and etching. Insulating layer 112 may include, for example, silicon oxide ($SiO_2$) and/or any other now known or later developed oxide layer materials. As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

As shown in FIGS. 1-3, initial structure 100 may also include gate structures 120a,b formed on fins 110a,b for forming field effect transistor (FET) structures. As shown in FIG. 1, gate structures 120a,b may traverse fins 110a,b. As shown in FIG. 1, gate structures 120a,b may be formed to contact sidewalls 128a,b of fins 110a,b. As best shown in FIGS. 2 and 3, gate structures 120a,b may also be formed to contact an uppermost surface 126a,b of fins 110a,b. As shown in FIGS. 1-3, gate structures 120a,b may each include, for example, a body 122a,b, respectively, formed on fins 110a,b. Gate structures 120a,b may also each include a cap 124a,b positioned on an uppermost surface of gate body 122a,b, respectively. Caps 118a,b may, for example, prevent the remainder of bodies 122a,b from being processed and/or removed during further processing of fins 110a,b. Gate structures 120a,b may be formed by conventional semiconductor fabrication techniques for forming a gate structures. For example, bodies 122a,b and caps 124a,b may be formed by deposition, patterning and etching using a mask (not shown). Bodies 122a,b and caps 124a,b may include conventional materials for a gate structure body and cap. For example, bodies 122a,b may include tungsten (W), and/or any other now known or later developed materials for a body of a gate structure. Caps 124a,b may include, for example, silicon nitride (SiN), and/or any other now known or later developed materials for a cap of a gate structure.

At this point in fabrication, source/drain regions may be formed in fins 110a,b for forming complimentary transistors in PFET region 104 and NFET region 106. For example, forming source/drain regions in fin 110a of PFET region 104 may include forming P-type source/drain regions (e.g., source/drain regions 132 of FIG. 2) for a PFET structure. Forming source/drain regions in fin 110b of NFET region 106 may include, for example, forming N-type source/drain regions (e.g., source/drain regions 188 of FIGS. 12 and 13) for an NFET structure. Source/drain regions may be formed in PFET region 104 and NFET region 106 at different points in the semiconductor fabrication process. For example, a mask may be formed over NFET region 106 to protect the region during the formation and doping of source/drain regions in PFET region 104 as described herein with respect to FIGS. 1 and 2. The mask may then be removed, and a new mask may be formed over PFET region 104 to protect the region during the formation and doping of source/drain regions in NFET region 106, as described herein with respect to FIGS. 5, 7, and 9-13.

Returning to FIGS. 1 and 2, source/drain regions 132 may be formed in fin 110a in PFET region 104 after gate structures 120a,b are formed, and a mask (not shown) is formed over NFET region 106. Source/drain regions 132 in fin 110a may include, for example, P-type source/drain regions for a PFET structure. Source/drain regions 132 may be formed by conventional semiconductor fabrication techniques for forming a P-type source/drain region. For example, as best shown in FIG. 2, openings 134 may be formed in fin 110a, and source/drain region material 136 may be formed in openings 134 by epitaxial growth and/or selective deposition. Source/drain regions 132 may, for example, be formed with in-situ P-type doping during epitaxial growth or by implanting P-type dopants after epitaxial growth, and thus may be referred to as "P-type source/drain regions." A P-type source/drain region may be formed by forming positively charged particles in the source/drain region by doping. For example, a P-type is element is introduced to the semiconductor to generate free hole (by "accepting" electron from semiconductor atom and "releasing" hole at the same time). The P-type dopant or acceptor atom must have one valence electron less than the host semiconductor. P-type dopants may include but are not limited to, for example, boron (B), indium (In) and gallium (Ga). Source/drain regions 132 may include any now known or later developed material for a P-type source/drain region for a PFET. For example, source/drain regions 132 may include silicon germanium and/or any other now known or later developed stressor for generating a compressive stress in the channel of the PFET to enhance the mobility of the holes created by the P-type dopant.

Figure 4:
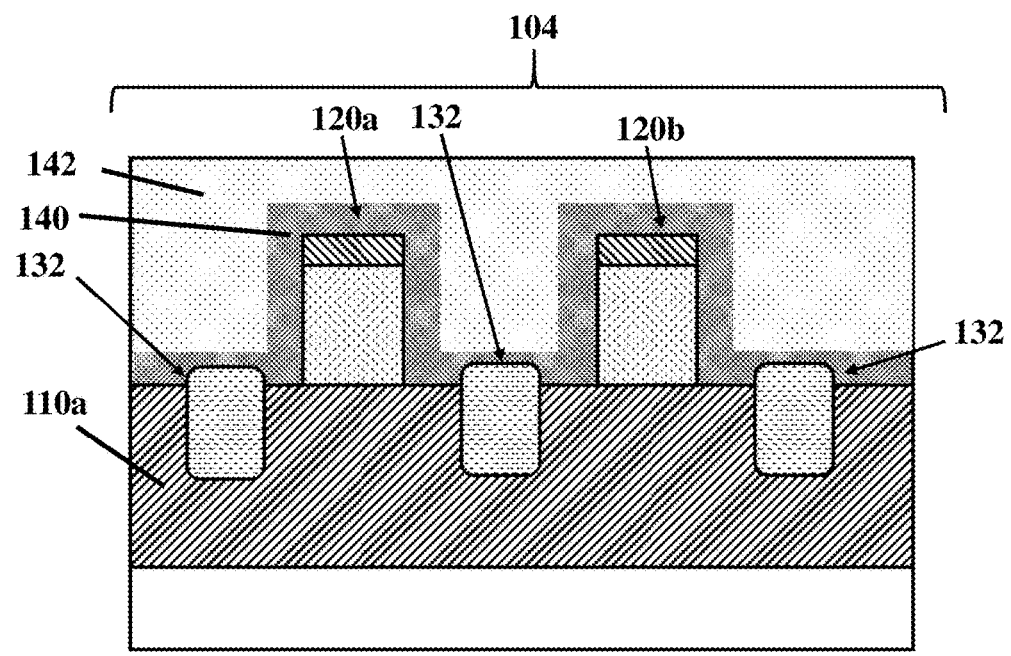
FIG. 4 shows a cross-sectional view of forming a spacer material layer and mask on the structure of FIG. 2, according to embodiments of the disclosure.

Turning next to FIG. 4, a cross-sectional view of forming a spacer material layer 140 and a mask 142 on the structures in PFET region 104 of FIG. 2 is shown. Spacer material layer 140 and mask 142 may be formed, for example, to protect the structures positioned in PFET region 104 (e.g., fin 110a, source/drain regions 132, and portions of gate structures 120a,b) during the formation of embedded source/drain regions in fin 110a in NFET region 106, according to embodiments of the disclosure. For example, mask 142 may protect PFET region 104 during the formation of trenches or openings in fin 110b (FIG. 3) in NFET region 106 (FIG. 3) for the source/drain regions. Spacer material layer 140 may, for example, protect PFET region 104 during the formation of epitaxial material in the trenches of fin 110b (FIG. 3) for the source/drain regions.

As shown in the example of FIG. 4, spacer material layer 140 may be formed in PFET region 104 above fin 110a, source/drain regions 132, and gate structures 120a,b. Spacer material layer 140 may be formed by conventional semiconductor fabrication techniques for forming a spacer material layer. For example, spacer material layer 140 may be formed in PFET region 104 by conformal deposition. Spacer material layer 140 may include, for example, nitride and/or any other now known or later developed spacer material.

As also shown in the example of FIG. 4, mask 142 may be formed above spacer material layer 140. Mask 142 may be formed by conventional semiconductor fabrication techniques for forming a mask on a semiconductor structure. For example, mask 142 may be formed over PFET region 104 by deposition and patterned etching using a mask (not shown). Mask 142 may include, for example, a polymer such as an allyl monomer and/or any other now known or later developed mask material.

Figure 5:
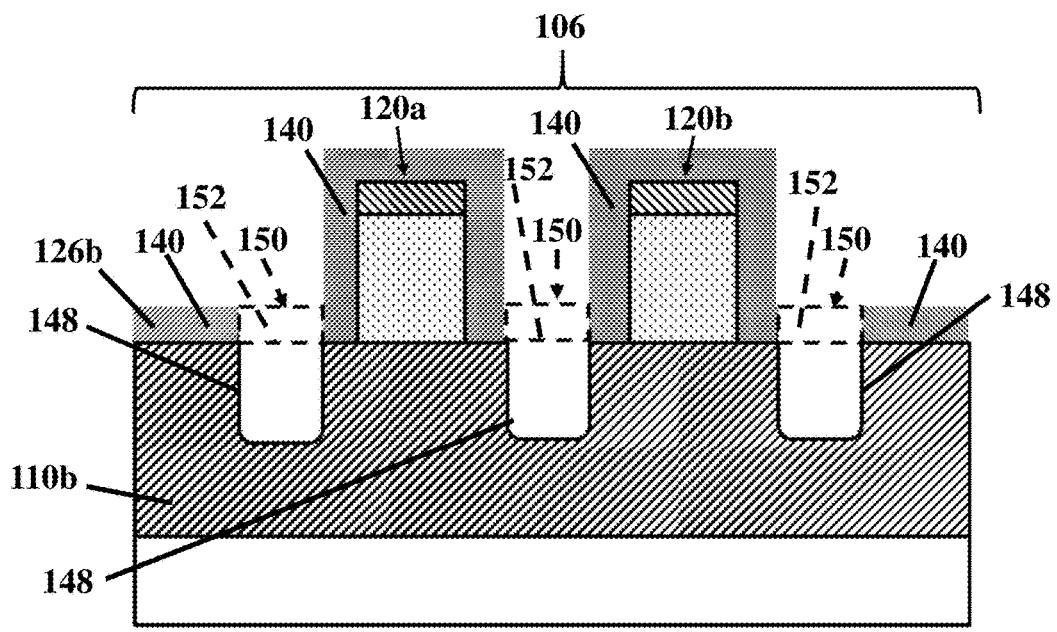
FIG. 5 shows forming the spacer material layer on and forming openings in the fin of the structure of FIG. 3, according to embodiments of the disclosure.

Turning to FIG. 5, a cross-sectional view of forming spacer material layer 140 in NFET region 106 of FIG. 3 is shown. Spacer material layer 140 may be formed over structures in NFET region 106, for example, to protect the structures during the formation of openings and epitaxial regions in fin 110b for source/drain region, as will be described herein. Spacer material layer 140 may be formed in NFET region 106, for example, over fin 110a and portions of gate structures 120a,b therein. Spacer material layer 140 may be formed in NFET region 106 by the same or similar semiconductor fabrication techniques and materials as described above with respect to FIG. 4. Although shown separately in FIGS. 4 and 5, it is understood that spacer material layer 140 may be formed, for example, substantially simultaneously in PFET region 104, and NFET region 106.

FIG. 5 also shows forming openings 148 in fin 110b of NFET region 106 for forming embedded source/drain regions, according to embodiments of the disclosure. As shown in FIG. 5, portions 150 (in phantom) of spacer material layer 140 may be removed to expose portions 152 of uppermost surface 126b of fin 110b for forming openings 148. Portions 152 (in phantom) of uppermost surface 126b may be positioned, for example, adjacent to gate structures 120a,b thereabove for forming source/drain regions adjacent to the gate structures. Portions 150 (in phantom) of spacer material layer 140 may be removed, for example, by selective etching, and/or any other now known or later developed semiconductor fabrication techniques for removing portions of a spacer material layer.

As also shown in FIG. 5, after removing portions 150 (in phantom), openings 148 may be formed in fin 110b at portions 152 (in phantom). Openings 148 may be formed, for example, by RIE using spacer material layer 140 as a mask, and/or any other now known or later developed semiconductor fabrication techniques for forming openings in a fin. As previously discussed, mask 142 (FIG. 4) on PFET region 104 (FIG. 4) may protect the PFET region during the formation of openings 148.

Figure 6:
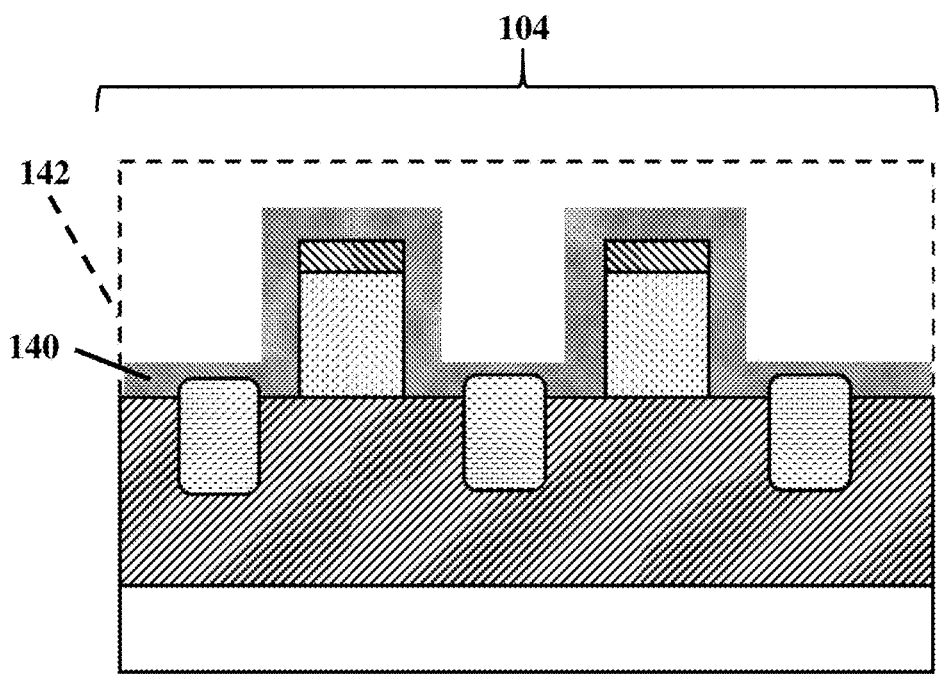
FIG. 6 shows removing the mask from the structure of FIG. 4, according to embodiments of the disclosure.

Turning to FIG. 6, a cross-sectional view of removing mask 142 (in phantom) from PFET region 104 of FIG. 4 is shown. Mask 142 (in phantom) may be removed, for example, during or after the formation of openings 148 (FIG. 5) in fin 110b (FIG. 5). For example, mask 142 (in phantom) may be removed during a RIE process for forming openings 148. As also shown in FIG. 6, removing mask 142 (in phantom) may re-expose spacer material layer 140. As discussed above, spacer material layer 140 may protect the structures of PFET region 104 during the formation of epitaxial regions in openings 148 (FIG. 5) of fin 110b (FIG. 5).

Figure 7:
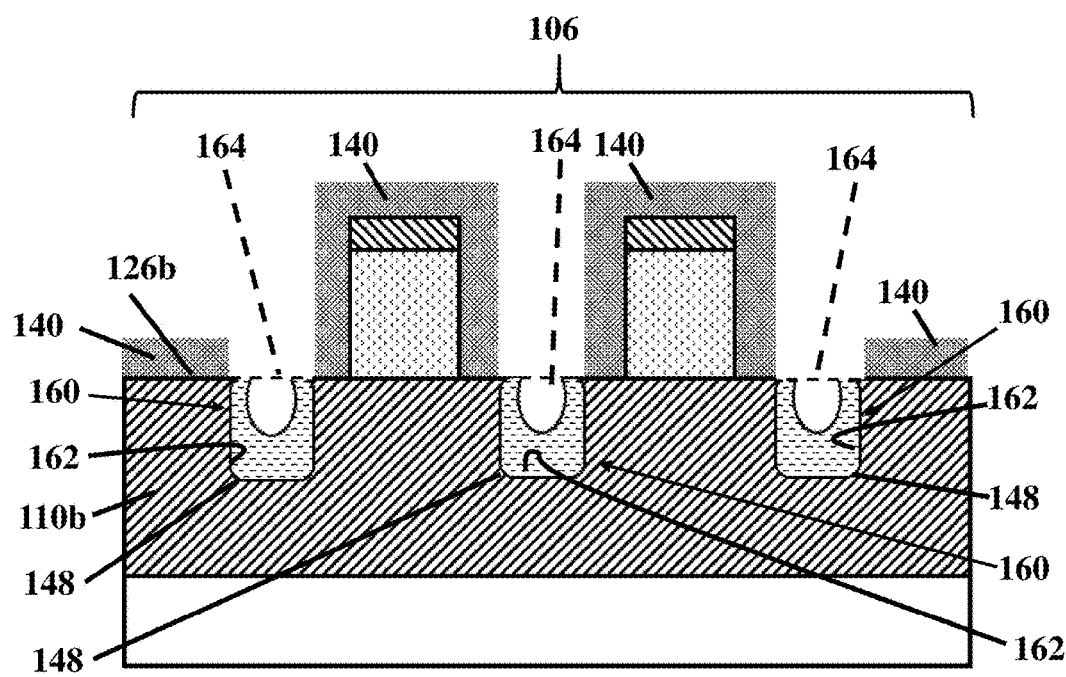
FIG. 7 shows forming a first epitaxial region in the openings of FIG. 5, according to embodiments of the disclosure.

Turning next to FIG. 7, forming a first epitaxial region 160 in openings 148 of fin 110b (see also FIG. 5), according to embodiments of the disclosure is shown. First epitaxial region 160 may be formed, for example, as part of embedded source/drain regions for field effect transistor (FET) structures. For example, first epitaxial regions 160 may be formed for N-type embedded source/drain regions for N-type FET structures in NFET region 106. First epitaxial region 160 may be formed with in-situ N-type doping during epitaxial growth or by implanting N-type dopants after epitaxial growth, and thus may be described herein as "N-type source/drain regions." An N-type epitaxial region for a source/drain region may be formed by forming negatively charged electrons in the epitaxial region by doping. For example, an N-type is element is introduced to the semiconductor to generate free electron (by "donating" electron to semiconductor). The N-type dopant must have one more valance electron than the semiconductor. Common donors in silicon (Si) may include: phosphorous (P), arsenic (As), antimony (Sb) and in gallium arsenic (GaAs): sulphur (S), selenium (Se), tin (Sn), silicon (Si), and carbon (C). N-type dopants may include, for example, phosphorous (P), arsenic (As), antimony (Sb). First epitaxial region 160 may include, for example, silicon monophosphate (SiP), silicon carbide (SiC), phosphorus-doped silicon carbide (SiCP), and/or any other now known or later developed material for an N-type source/drain region.

First epitaxial region 160 may be formed to include a low dopant concentration epitaxial region. Forming first epitaxial region 160 to include a low dopant concentration may prevent the diffusion of phosphorus out of the transistor structure and improve the performance of the structure. For example, first epitaxial region may include a dopant concentration of approximately 0 atoms per centimeter cubed (atoms/cm$^3$) to approximately $1\times10^{20}$ atoms/cm$^3$.

As discussed above, first epitaxial region 160 may be formed by epitaxial growth. For example, first epitaxial region 160 may be epitaxially grown on an exposed surface 162 of fin 110b in openings 148. As shown in FIG. 7, epitaxial region 160 may be formed to partially fill openings 148 in fin 110b. Forming first epitaxial region 160 to partially fill openings 148 may, for example, allow for a reduction in processing time and materials used. As shown by line 164 (in phantom) in FIG. 7, in another non-limiting example, first epitaxial region 160 may alternatively be formed to completely fill openings 148 in fin 110b.

Figure 8:
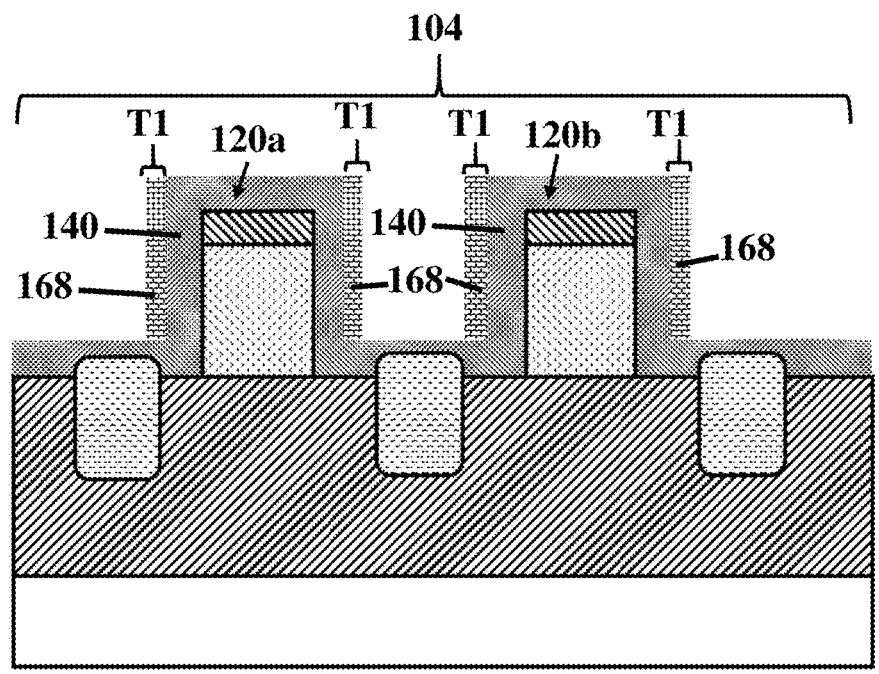
FIG. 8 shows forming a second spacer material layer on the structure of FIG. 6, according to embodiments of the disclosure.
Figure 9:
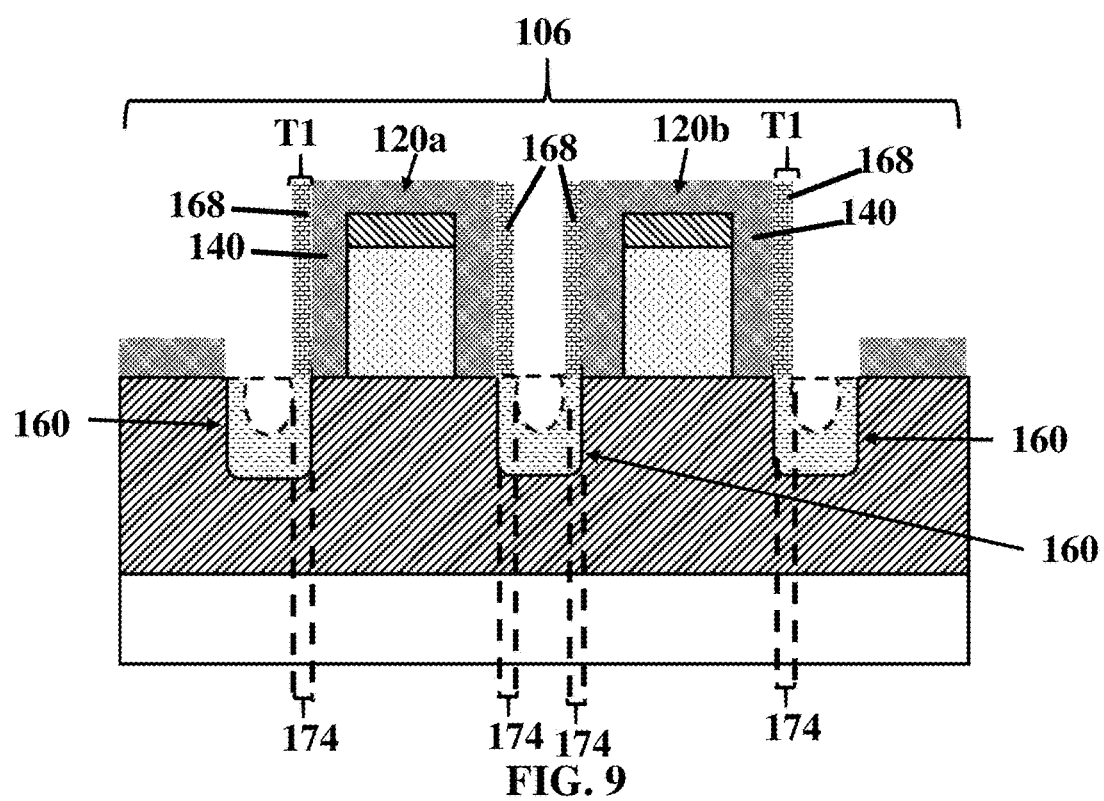
FIG. 9 shows forming a second spacer material layer on the structure of FIG. 7 and removing a portion of the first epitaxial region, according to embodiments of the disclosure.

Turning now to FIGS. 8-9, in contrast to conventional embedded source/drain region formation, a portion of first epitaxial region 160 (FIG. 9) may be removed to allow a remaining portion of the first epitaxial region to include a substantially uniform sidewall thickness. As shown in FIG. 8, removing a portion of the first epitaxial region may include forming a second spacer material layer 168 in PFET region 104 and NFET region 106. For example, as shown in FIG. 8 second spacer material layer may be formed on spacer material layer 140 adjacent to the sidewalls of gate structures 120a,b in PFET region 104. As shown in FIG. 9, second spacer material layer 168 may be formed in NFET region 106 on spacer material layer 140 adjacent to the sidewalls of gate structures 120a,b, and on a portion 174 of first epitaxial region 160 (FIG. 7). Second spacer material layer 168 may be formed in PFET region 104 and NFET region 106, for example, as part of a final spacer structure on gate structures 120a,b. As shown in FIG. 9, second spacer material layer 168 may also be formed in NFET region 106, for example, as a mask to protect first portion 174 of first epitaxial region 160 during removal of a second portion not covered by second spacer material layer 168.

Although shown separately in FIGS. 8 and 9, second spacer material layer 168 may be formed substantially simultaneously in PFET region 104 of FIG. 8 and NFET region 106 in FIG. 9. As shown in FIG. 8, second spacer material layer 168 may be formed in PFET region 104 on spacer material layer 140, adjacent to the sidewalls of gate structures 120*a,b*. As shown in FIG. 9, second spacer material layer 168 may be formed in NFET region 106 on spacer material layer 140 adjacent to the sidewalls of gate structures 120*a,b*, and above first portion 174 of first epitaxial region 160. Second spacer material layer 168 may be formed by conventional semiconductor fabrication techniques for forming a spacer material layer. In the example of FIG. 9, second spacer material layer 168 may be formed by deposition on spacer material layer 140 and first epitaxial region 160, and selectively etched (e.g., by RIE) using a mask (not shown) such that second spacer material layer 168 remains above first portion 174 of first epitaxial region 160. Second spacer material layer 168 may include, for example, nitride and/or any other now known or later developed materials for a spacer. Second spacer material layer 168 may include a sidewall thickness T1. T1 may be approximately 2 nanometers to approximately 3 nanometers.

Figure 10:
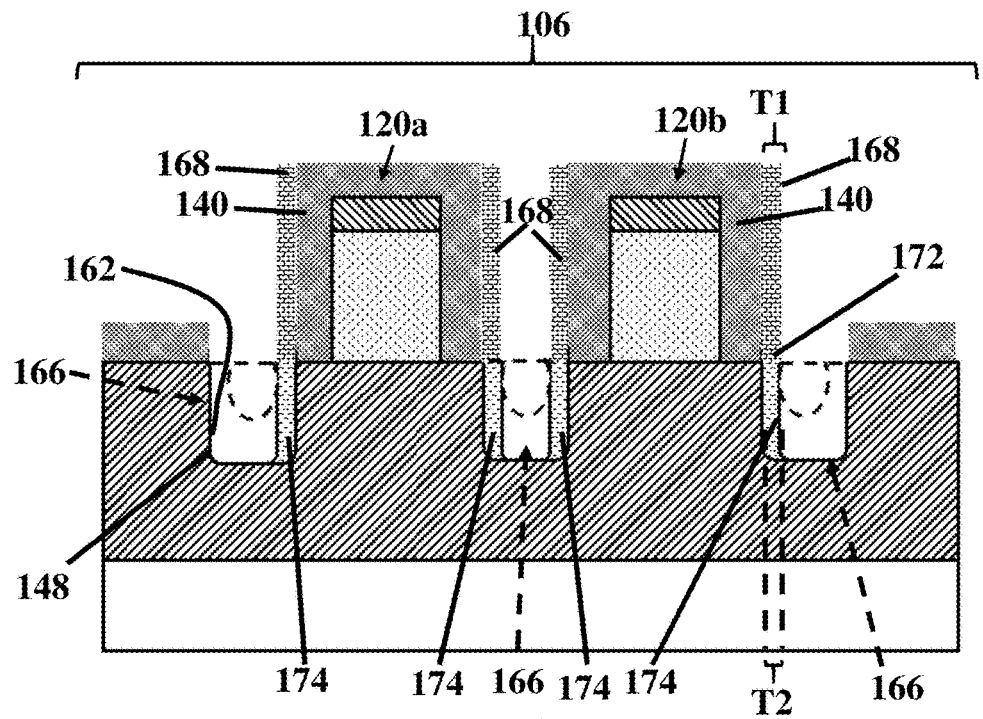
FIGS. 10 and 11 show removing a portion of the first epitaxial region of FIG. 9, according to embodiments of the disclosure.
Figure 11:
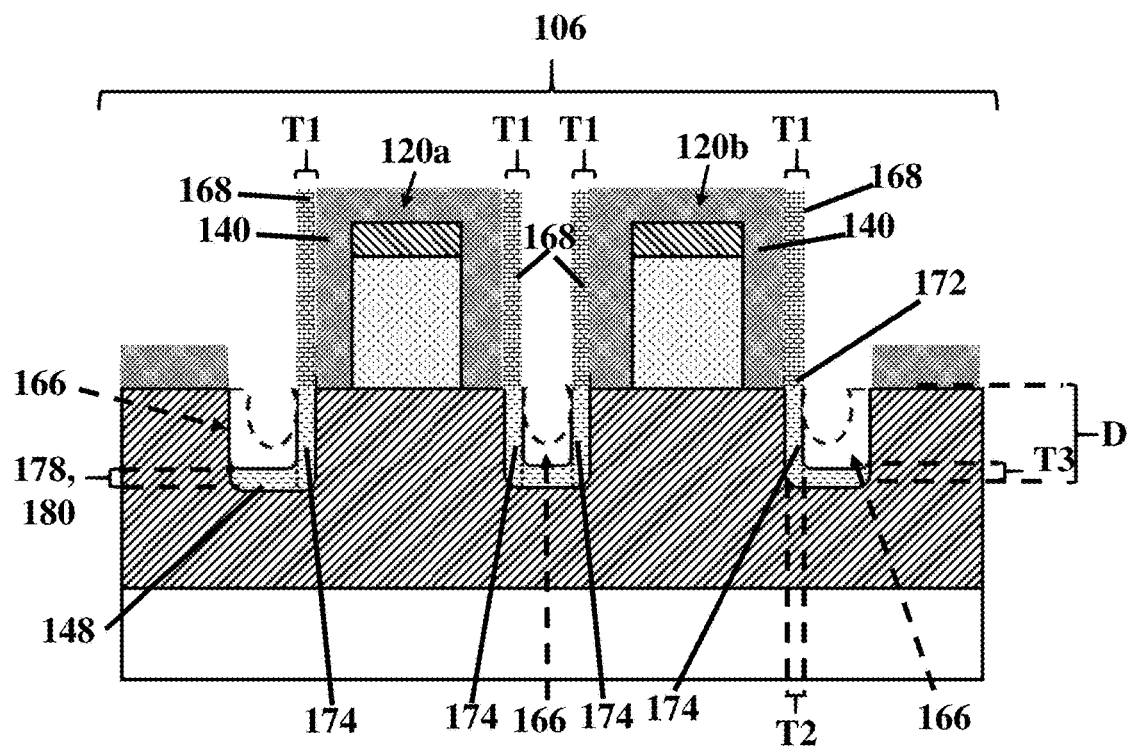

In contrast to conventional embedded source/drain region formation, FIGS. 10-11 show removing a second portion 166 (in phantom) of first epitaxial region 160 (FIG. 9), according to embodiments of the disclosure. As discussed above, removing a portion of first epitaxial region 160 (FIG. 9) may allow for a remaining portion of the first epitaxial region (e.g., first portion 174) to have a substantially uniform thickness along the walls of openings 148. As shown in FIGS. 10 and 11, second portion 166 (in phantom) of first epitaxial region 160 (FIG. 9) may be removed after forming second spacer material layer 168 on first portion 174 as described above. Second portion 166 (in phantom) may be removed using second spacer material layer 168 as a mask to protect first portion 174 of first epitaxial region 160 (FIG. 9). As shown in FIGS. 10 and 11, after removing second portion 166 (in phantom), first portion 174 may remain in openings 148 and include a substantially uniform sidewall thickness T2. For example, since second spacer material layer 168 is used as a mask during the removal of second portion 166 (in phantom), sidewall thickness T1 of the second spacer material layer may control uniform sidewall thickness T2 of remaining first portion 174. Thickness T1 of second spacer material layer 168 may therefore be formed, for example, to include any desirable value for thickness T2 of remaining first portion 174 of first epitaxial region 160. Second portion 166 (in phantom) may be removed, for example, by RIE and/or any other now known or later developed semiconductor fabrication techniques for removing an epitaxial material.

As shown in the example of FIG. 10, removing second portion 166 (in phantom) may include re-exposing surface 162 of fin 110*b*. In another non-limiting example shown in FIG. 10, removing second portion 166 (in phantom) may alternatively include, allowing another portion 178 of first epitaxial region 160 (FIG. 9) to remain at a bottommost portion 180 of openings 148. As shown in FIG. 10, portion 178 may include a substantially uniform thickness T3 at bottommost portion 180 of openings 148. Thickness T3 may be greater than, smaller than, or equal to sidewall thickness T1 of first portion 174. Thickness T3 of portion 178 (in phantom) of first epitaxial region 160 may be controlled by a depth D of removed second portion 166 (in phantom). For example, where second portion 166 (in phantom) is removed by a RIE process, the longer the duration of the RIE process, the smaller the thickness T3 of portion 178.

As also shown in FIGS. 10 and 11, where an opening 148 in fin 110*b* is positioned between two gate structures 120*a,b*, second spacer material layer 168 formed on each gate structure may mask first portion 174 of first epitaxial region on both sides of the opening, allowing the first portion to remain adjacent to each gate structure thereabove. Alternatively, where an opening 148 is positioned adjacent to one gate structure 120*a*, or 120*b*, second spacer material layer 168 may cover first portion 174 on one side of the opening, allowing the first portion to remain on the sidewall adjacent to the gate structure. Additionally, as shown in FIG. 11, in the example where portion 178 (in phantom) of first epitaxial region 160 (FIG. 9) is allowed to remain after second portion 166 (in phantom) is removed, the remaining portions 174, 178 of first epitaxial region 160 (FIG. 9) may be substantially U-shaped and/or L-shaped, depending on whether openings 148 is positioned adjacent to one or two gate structures.

Forming a remaining portion (e.g., portions 174 and/or 178) of first epitaxial region 160 (FIG. 9) to include a substantially uniform thickness along the walls of openings 148 may allow for the formation of a low dopant concentration epitaxial region of a source/drain region that prevents and/or mitigates leakage current and performance degradation of the resulting FET structure.

Figure 12:
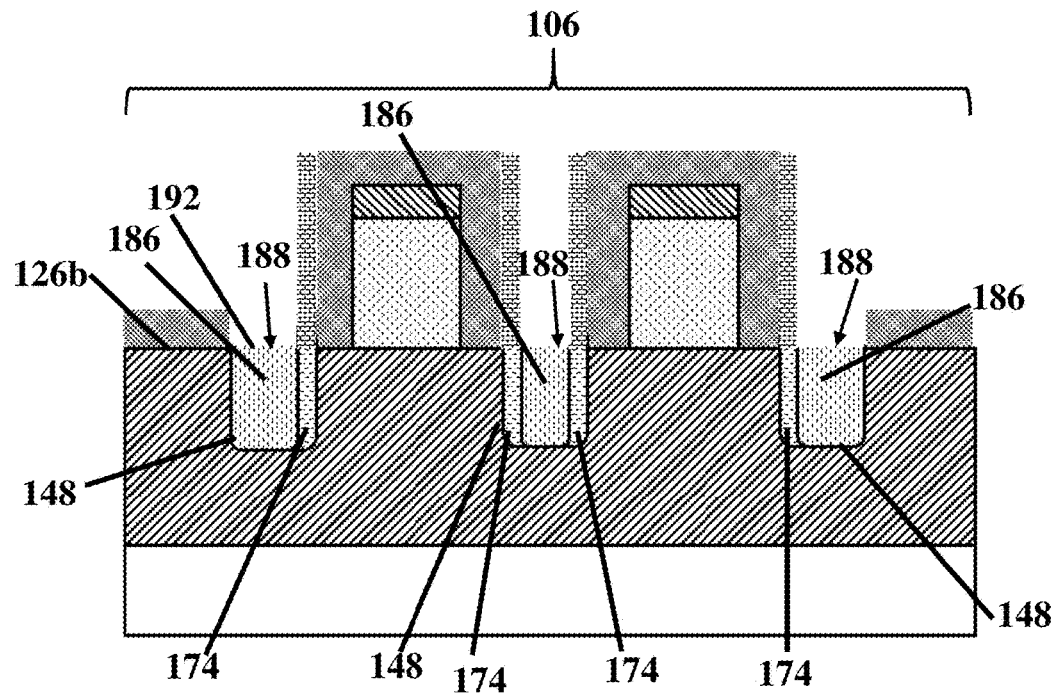
FIGS. 12 and 13 show forming a second epitaxial region on the structures of FIGS. 10 and 11, respectively, according to embodiments of the disclosure.
Figure 13:
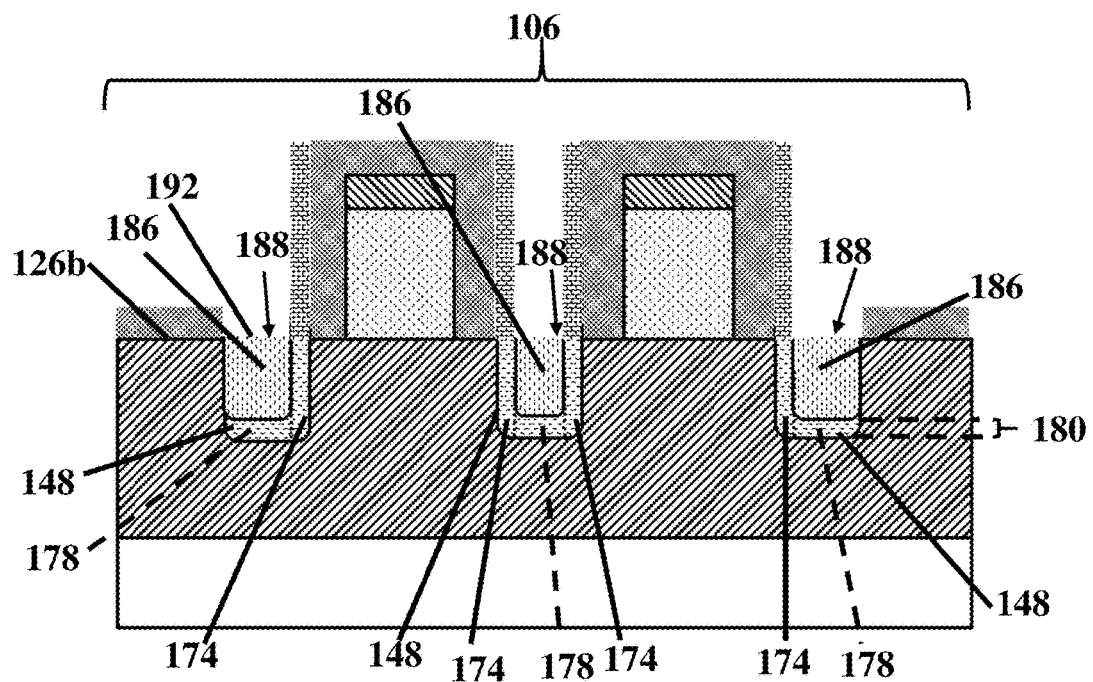

Turning to FIGS. 12 and 13, forming a second epitaxial region 186 in openings 148 after removing second portion 166 (FIGS. 10 and 11, in phantom) of first epitaxially region 160 (FIG. 9) is shown. Second epitaxial region 186 may be formed after the removal of second portion 166 (FIGS. 10 and 11, in phantom) of first epitaxial region 160 (FIG. 9) as described above. Second epitaxial region 186 may be formed as part of embedded source/drain regions 188 that also include remaining portions 174 and/or 178 of first epitaxial region 160 (FIG. 9). Embedded source/drain regions 188 may include N-type source/drain regions for N-type field effect transistor (NFET) structures in NFET region 106. Similarly to first epitaxial region 160 (see FIG. 7), second epitaxial region 186 may therefore be formed with in-situ N-type doping during epitaxial growth or by implanting N-type dopants after epitaxial growth, and thus may be described herein as "N-type source/drain regions." Second epitaxial region 186 may include, for example, silicon monophosphate (SiP), silicon carbide (SiC), phosphorus-doped silicon carbide (SiCP), and/or any other now known or later developed material for an N-type source/drain region. In contrast to first epitaxial region 160, second epitaxial region 186 may be formed to include a high dopant concentration epitaxial region. Second epitaxial region 186 may include a high dopant concentration, for example, for increased performance of an NFET structure, and further reduction in the resistance at the interface between a subsequently formed contact and the source/drain region of the NFET structure. For example, second epitaxial region 186 may include a dopant concentration of approximately $1\times10^{20}$ atoms/cm$^3$ to approximately $1\times10^{22}$ atoms/cm$^3$.].

Second epitaxial region 186 may be formed, for example, by epitaxial growth. FIG. 12 shows forming second epitaxial region 186 in openings 148 of the example of FIG. 10. For example, as discussed above with respect to FIG. 10, removing second portion 166 (FIG. 10, in phantom) of first epitaxial region 160 (FIG. 9) may include, among other things, exposing surface 162 of fin 110*b* and allowing first portion 174 of the first epitaxial region to remain in openings 148. Forming second epitaxial region 186 in the example of FIG. 12 may therefore include epitaxially growing second epitaxial region 186 on exposed surface 162 and/or the exposed surface of first portion 174 in opening 148. FIG. 13 shows forming second epitaxial region 186 in openings 148 of FIG. 11. As discussed above with respect to FIG. 11, removing second portion 166 (FIG. 11, in phantom) of first epitaxial region 160 (FIG. 9) may include among other things, allowing first portion 174 and another portion 178 of the first epitaxial region to remain in openings 148. Forming second epitaxial region 186 in the example of FIG. 13 may therefore include epitaxially growing second epitaxial region 186 on portions 174 and 178 of first epitaxial region 160 (FIG. 9) in openings 148. As also shown in FIGS. 12 and 13, an uppermost surface 192 of second epitaxial region 186 may be substantially planar with uppermost surface 126b of fin 110b. Forming uppermost surface 192 planar with uppermost surface 126b may include, for example, etching second epitaxial region 186 after formation.

Figure 14:
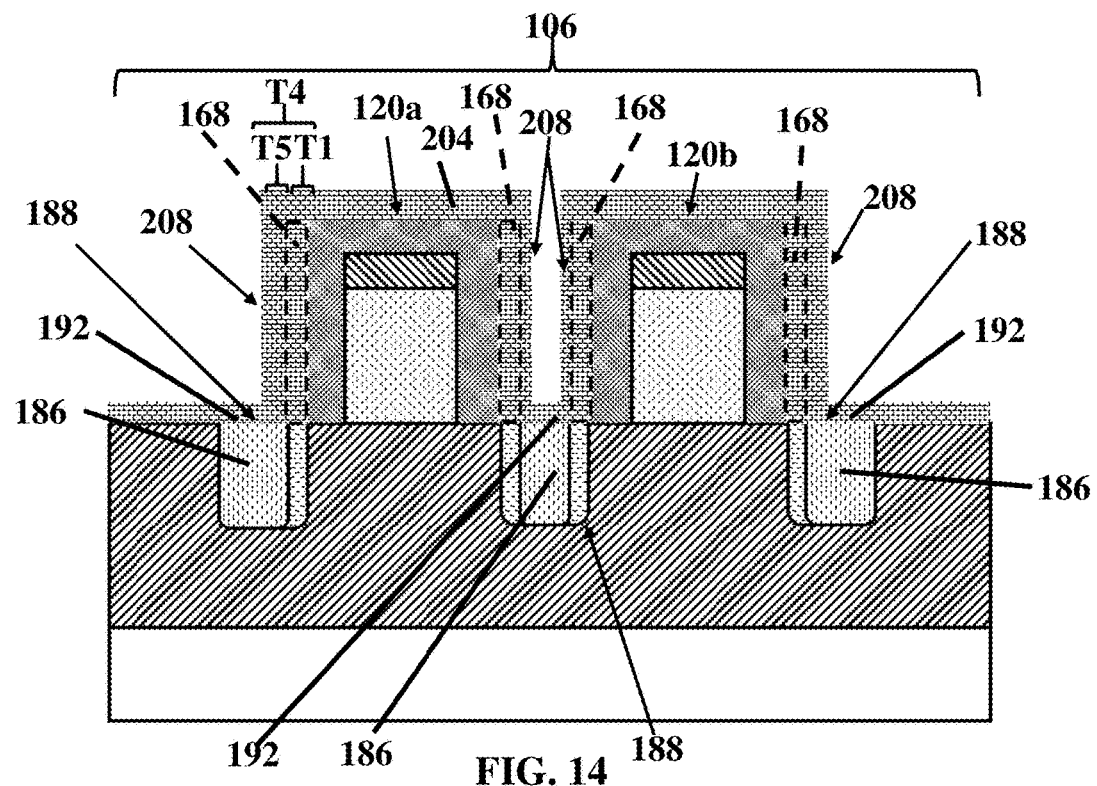
FIG. 14 shows forming a third spacer material layer on the structure of FIG. 12, according to embodiments of the disclosure.
Figure 15:
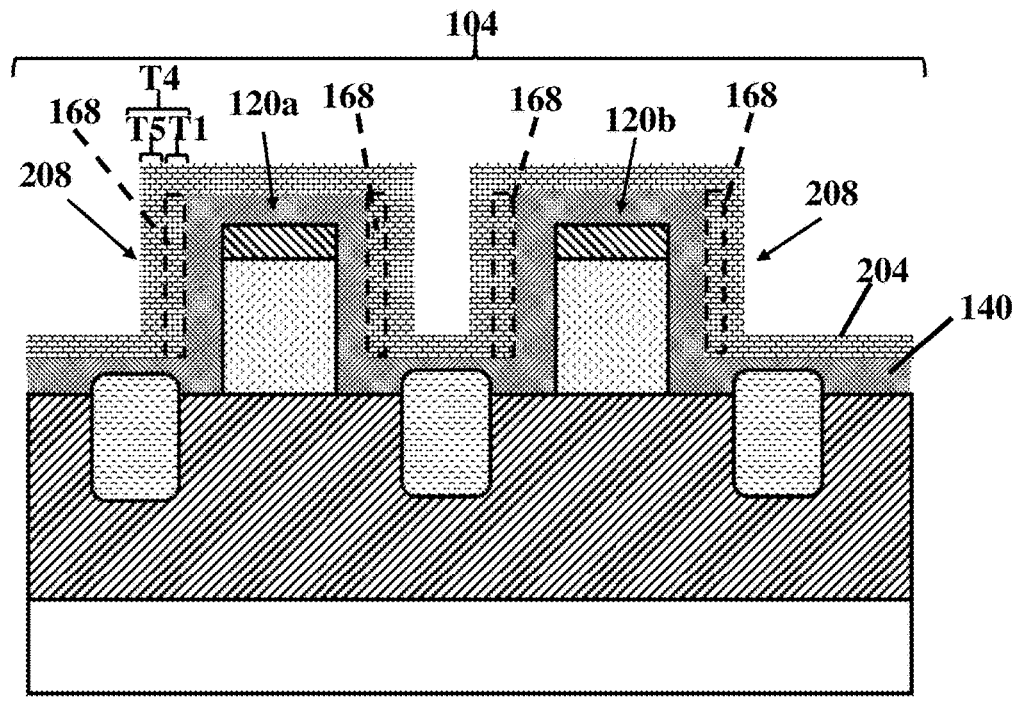
FIG. 15 shows forming a third spacer material layer on the structure of FIG. 8, according to embodiments of the disclosure.

Turning to FIGS. 14 and 15, forming a third spacer material layer 204 in PFET region 104 and NFET region 106, according to embodiments of the disclosure is shown. Third spacer material layer 204 may be formed, for example, for a final wing spacer structure 208 to protect gate structures 120a,b during further processing of the semiconductor structure. Final wing spacer structure 208 may be positioned on spacer material layer 140 adjacent to the sidewalls of gate structures 120a,b. Final wing spacer structure 208 may include, for example, second spacer material layer 168 and third spacer material layer 204. Final wing spacer structure 208, may include, for example, a sidewall thickness T4 including a sidewall thickness T1 of second spacer material layer 168 (in phantom), and a sidewall thickness T5 of third spacer material layer 204. Sidewall thickness T4 of final wing spacer structure 208 may include any desirable thickness for a final spacer structure. In the example of FIGS. 14 and 15, sidewall thickness T4 may include approximately 5 nanometers to approximately 6 nanometers, sidewall thickness T1 may include approximately 2 nanometers to approximately 3 nanometers and sidewall thickness T5 may include approximately 3 nanometers to approximately 4 nanometers.

Third spacer material layer 204 may be formed, for example, after formation and etching of second epitaxial region 186 as discussed above with respect to FIGS. 12 and 13. Third spacer material layer 204 may be formed, for example, substantially simultaneously in PFET region 104 and NFET region 106. Turning to FIG. 14, third spacer material layer 204 is shown being formed on the structure of FIG. 12 in NFET region 106. For example, as shown in FIG. 14, third spacer material layer 204 may be formed on second spacer material layer 168 (in phantom), exposed portions of uppermost surface 126b of fin 110b, and uppermost surface 192 of second epitaxial region 186 of embedded source/drain regions 188. Turning to FIG. 15, third spacer material layer 204 is shown being formed on the structure of FIG. 8 in PFET region 104. For example, as shown in FIG. 15, third spacer material layer 204 may be formed on second spacer material layer 168 (in phantom) and spacer material layer 140. Third spacer material layer 204 may be formed by conventional semiconductor fabrication techniques and materials for forming a spacer material layer. For example, third spacer material layer 204 may be formed by deposition.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s). As used herein, the term "substantially L-shaped may refer to a shape having two major line segments in the shape of the letter 'L' but with some variation in the shape of the segments and/or the number of minor line segments. As used herein, the term "substantially U-shaped may refer to a shape having three major line segments in the shape of the letter 'U" but with some variation in the shape of the segments and/or the number of minor line segments.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming an embedded source/drain region in a substrate, the method comprising:
   forming a trench in the substrate adjacent to a gate structure positioned thereon, the trench having a first sidewall, a second sidewall opposite the first sidewall, and a bottommost surface extending between the first sidewall and the second sidewall;

forming a first epitaxial region at least partially in the trench;

forming a first spacer layer on the gate structure and on a portion of an uppermost surface of the first epitaxial region adjacent to the gate structure;

removing a first portion of the first epitaxial region using the first spacer layer as a mask by exposing a portion of the substrate at the bottommost surface of the trench, wherein after the removing the first portion of the epitaxial region a thickness of a remaining portion of the epitaxial region has a substantially uniform sidewall thickness; and forming a second epitaxial region in the trench abutting the remaining portion of the first epitaxial region, and on the portion of the substrate exposed at the bottommost surface of the trench, to form the embedded source/drain region.

2. The method of claim 1, wherein forming the first epitaxial region includes epitaxially growing a low dopant concentration silicon monophosphide (SiP), and forming the second epitaxial region includes epitaxially growing a high dopant concentration silicon monophosphide (SiP).

3. The method of claim 1, wherein removing the first portion of the first epitaxial region includes leaving a portion of the first epitaxial region along the bottommost surface of the trench, the portion having a substantially uniform thickness.

4. The method of claim 1, wherein the substantially uniform sidewall thickness of the remaining epitaxial region is controlled by a thickness of the first spacer layer.

5. The method of claim 1, wherein a depth of the second epitaxial region within the trench is controlled by an amount of the first portion of the first epitaxial region removed before forming the second epitaxial region.

6. The method of claim 1, further comprising after forming the second epitaxial region, forming a second spacer layer on the first spacer layer and a portion of an uppermost surface of the second epitaxial region to form a final spacer structure on the gate structure.

7. The method of claim 1, wherein forming the first epitaxial region includes completely filling the trench.

8. The method of claim 1, wherein forming the first epitaxial region includes partially filling the trench.

9. A method of forming a source/drain region comprising:

forming a first spacer material layer on a P-type field effect transistor (PFET) region of a substrate and an N-type field effect transistor (NFET) region of the substrate, the NFET region including a gate structure positioned on the substrate;

forming a mask above the first spacer material layer in the PFET region;

forming an opening in the first spacer material layer and the substrate adjacent to the gate structure in the NFET region;

removing the mask;

forming a first epitaxial region in at least a portion of the opening;

forming a second spacer material layer on the first spacer material layer and on a portion of an uppermost surface of the first epitaxial region adjacent to the gate structure;

removing a first portion of the first epitaxial region using the second spacer material layer as a mask, wherein after removing the first portion a remaining portion of the first epitaxial region includes a substantially uniform sidewall thickness; and forming a second epitaxial region abutting the remaining portion of the first epitaxial region in the opening to form the source/drain region.

10. The method of claim 9, wherein the first spacer material layer is configured to protect the PFET from physical and electrical damage during the removing the first portion of the first epitaxial region.

* * * * *